(12) United States Patent
Goff et al.

(10) Patent No.: US 8,386,199 B2
(45) Date of Patent: Feb. 26, 2013

(54) BATTERY MONITORING ALGORITHMS FOR VEHICLES

(75) Inventors: Lonnie Calvin Goff, Tempe, AZ (US); Michael Richard Conley, Thousand Oaks, CA (US); Mark Edmond Eidson, Tempe, AZ (US)

(73) Assignee: 4 Peaks Technology LLC, Tempe, AZ (US)

( * ) Notice: Subject to any disclaimer, the term of this patent is extended or adjusted under 35 U.S.C. 154(b) by 523 days.

(21) Appl. No.: 12/319,544

(22) Filed: Jan. 8, 2009

(65) Prior Publication Data
US 2010/0174498 A1    Jul. 8, 2010

(51) Int. Cl.
*G01R 31/36* (2006.01)
(52) U.S. Cl. ............... 702/63; 702/64; 702/65; 702/79; 702/130; 702/182
(58) Field of Classification Search .............. 713/340; 702/63–65, 79, 130, 182; 701/1, 29; 700/32, 700/90; 324/71.1, 427, 429; 320/127, 137
See application file for complete search history.

(56) References Cited

U.S. PATENT DOCUMENTS

| | | | |
|---|---|---|---|
| 3,440,100 A | 4/1969 | Ardanuy et al. | |
| 4,012,681 A | 3/1977 | Finger et al. | |
| 4,229,687 A | 10/1980 | Newman | |
| 4,234,840 A | 11/1980 | Konrad et al. | |
| 4,289,836 A | 9/1981 | Lemelson | |
| 4,388,584 A | 6/1983 | Dahl et al. | |
| 4,564,798 A | 1/1986 | Young | |
| 4,586,788 A | 5/1986 | Hansen | |
| 4,665,370 A | 5/1987 | Holland | |
| 4,708,918 A | 11/1987 | Fitzgerald et al. | |
| 4,866,428 A | 9/1989 | Hinkle | |
| 4,929,931 A | 5/1990 | McCuen | |
| 4,937,528 A * | 6/1990 | Palanisamy | 324/430 |
| 5,079,716 A | 1/1992 | Lenhardt et al. | |
| 5,162,741 A * | 11/1992 | Bates | 324/431 |
| 5,349,535 A | 9/1994 | Gupta | |
| 5,493,199 A | 2/1996 | Koenck et al. | |
| 5,495,503 A | 2/1996 | King et al. | |
| 5,534,759 A | 7/1996 | Evans et al. | |
| 5,607,794 A | 3/1997 | Koenig | |
| 5,625,337 A | 4/1997 | Medawar | |
| 5,656,919 A | 8/1997 | Proctor et al. | |
| 5,691,742 A | 11/1997 | O'Connor et al. | |
| 5,699,050 A | 12/1997 | Kanazawa | |
| 5,710,503 A | 1/1998 | Sideris et al. | |
| 5,760,587 A | 6/1998 | Harvey | |
| 5,912,547 A * | 6/1999 | Grabon | 320/150 |
| 6,107,802 A | 8/2000 | Matthews et al. | |

(Continued)

OTHER PUBLICATIONS

U.S. Appl. No. 12/070,793, Office Action dated Feb. 1, 2011.

(Continued)

*Primary Examiner* — Mohamed Charioui
*Assistant Examiner* — Elias Desta
(74) *Attorney, Agent, or Firm* — Larry E. Henneman, Jr.; Henneman & Associates PLC (57) ABSTRACT

A system for monitoring the starter battery of a vehicle includes a central processing unit, a voltage sensor, a temperature sensor, a timer, a data store, and a display. A collection of computer software algorithms are executed by the central processing unit to ascertain the operational state of a vehicle's starter battery. The algorithms are operative to determine engine start time, initial start voltage drop, and the charge state of the battery.

92 Claims, 6 Drawing Sheets

U.S. PATENT DOCUMENTS

| | | | |
|---|---|---|---|
| 6,173,350 B1 | 1/2001 | Hudson et al. | |
| 6,211,644 B1 | 4/2001 | Wendelrup et al. | |
| 6,222,345 B1 | 4/2001 | Yamanashi | |
| 6,400,123 B1 | 6/2002 | Bean et al. | |
| 6,507,169 B1 | 1/2003 | Holtom et al. | |
| 6,549,014 B1 | 4/2003 | Kutkut et al. | |
| 6,611,740 B2 | 8/2003 | Lowrey et al. | |
| 6,710,578 B1 | 3/2004 | Sklovsky | |
| 6,791,464 B2 | 9/2004 | Huang | |
| 6,795,782 B2 | 9/2004 | Bertness et al. | |
| 6,983,212 B2 | 1/2006 | Burns | |
| 7,061,208 B2 | 6/2006 | Nishihata et al. | |
| 7,116,216 B2 | 10/2006 | Andreasen et al. | |
| 7,126,341 B2 | 10/2006 | Bertness et al. | |
| 7,445,870 B2 | 11/2008 | Taguchi et al. | |
| 7,786,851 B2 | 8/2010 | Drew et al. | |
| 7,928,735 B2 * | 4/2011 | Huang et al. | 324/426 |
| 8,102,145 B2 | 1/2012 | Merrill et al. | |
| 2002/0175655 A1 | 11/2002 | Huykman et al. | |
| 2003/0051928 A1 * | 3/2003 | Raftari et al. | 180/65.2 |
| 2003/0139888 A1 | 7/2003 | Burns | |
| 2004/0056640 A1 | 3/2004 | Valand | |
| 2004/0099846 A1 | 5/2004 | Lee et al. | |
| 2005/0162172 A1 | 7/2005 | Bertness | |
| 2005/0177288 A1 | 8/2005 | Sullivan et al. | |
| 2005/0218902 A1 | 10/2005 | Restaino et al. | |
| 2005/0275383 A1 | 12/2005 | Ishishita | |
| 2006/0028172 A1 | 2/2006 | Vaillancourt et al. | |
| 2006/0043933 A1 * | 3/2006 | Latinis | 320/132 |
| 2006/0118157 A1 | 6/2006 | Johnson et al. | |
| 2006/0152224 A1 | 7/2006 | Kim et al. | |
| 2006/0186857 A1 | 8/2006 | Matty et al. | |
| 2006/0217914 A1 | 9/2006 | Bertness | |
| 2007/0069734 A1 | 3/2007 | Bertness | |
| 2007/0075679 A1 | 4/2007 | Ha et al. | |
| 2007/0090844 A1 | 4/2007 | Klang | |
| 2007/0241614 A1 | 10/2007 | Busdiecker et al. | |
| 2008/0239628 A1 | 10/2008 | Tatebayashi et al. | |
| 2008/0252437 A1 | 10/2008 | Bertness et al. | |
| 2008/0311466 A1 | 12/2008 | Yang et al. | |
| 2009/0100995 A1 | 4/2009 | Fisher | |
| 2009/0144622 A1 | 6/2009 | Evans et al. | |
| 2009/0210736 A1 | 8/2009 | Goff et al. | |
| 2009/0212781 A1 | 8/2009 | Bertness et al. | |
| 2009/0228171 A1 | 9/2009 | Goff et al. | |
| 2009/0246607 A1 | 10/2009 | Shinyashiki et al. | |
| 2009/0322340 A1 * | 12/2009 | Zhang et al. | 324/433 |
| 2010/0179778 A1 | 7/2010 | Goff et al. | |
| 2010/0217551 A1 | 8/2010 | Goff et al. | |
| 2010/0292942 A1 | 11/2010 | Golf et al. | |
| 2011/0048485 A1 | 3/2011 | Goff et al. | |
| 2011/0156648 A1 | 6/2011 | Goff et al. | |

OTHER PUBLICATIONS

U.S. Appl. No. 12/070,793, Office Action dated Oct. 13, 2011.
U.S. Appl. No. 12/075,212, Office Action dated Mar. 18, 2011.
U.S. Appl. No. 12/321,310, Office Action dated Dec. 3, 2010.
U.S. Appl. No. 12/321,310, Final Office Action dated May 9, 2011.
U.S. Appl. No. 12/380,236, Office Action dated May 31, 2011.
U.S. Appl. No. 12/454,454, Office Action dated Jun. 13, 2011.
U.S. Appl. No. 12/584,252, Office Action dated Aug. 17, 2011.
U.S. Appl. No. 12/070,793, Interview Summary dated Feb. 21, 2012.
U.S. Appl. No. 12/075,212, Office Action dated Nov. 2, 2011.
U.S. Appl. No. 12/075,212, Interview Summary dated Feb. 21, 2012.
U.S. Appl. No. 12/321,310, Office Action dated Dec. 20, 2011.
U.S. Appl. No. 12/321,310, Interview Summary dated Feb. 17, 2012.
U.S. Appl. No. 12/380,236, Office Action dated Jan. 30, 2012.
U.S. Appl. No. 12/584,252, Office Action dated Jan. 19, 2012.
U.S. Appl. No. 12/075,212, Interview Summary dated Jul. 3, 2012.
U.S. Appl. No. 12/321,310, Interview Summary dated Jul. 10, 2012.
U.S. Appl. No. 12/584,252, Notice of Abandonment dated Aug. 14, 2012.
U.S. Appl. No. 12/075,212, OA dated May 8, 2012.
U.S. Appl. No. 12/321,310, OA dated Apr. 20, 2012.
U.S. Appl. No. 12/454,454, OA dated Apr. 25, 2012.
U.S. Appl. No. 12/655,275, OA dated Apr. 13, 2012.
U.S. Appl. No. 13/272,905, Office Action dated Dec. 21, 2012, 18 pages.

* cited by examiner

BATTERY MONITORING ALGORITHMS FOR VEHICLES

CROSS REFERENCE TO RELATED APPLICATIONS

This application is related to application Ser. No. 12/075,212 filed by the present inventors on Mar. 10, 2008 and entitled "Battery Monitor System Attached to a Vehicle Wiring Harness". This application also relates to application Ser. No. 12/070,793 filed by the present inventors on Feb. 20, 2008 and entitled "Multi-function Battery Monitor System for Vehicles".

FEDERALLY SPONSORED RESEARCH OR DEVELOPMENT

Not Applicable

SEQUENCE LISTING, TABLE OR COMPUTER PROGRAM LISTING ON CD

Not Applicable

BACKGROUND OF THE INVENTION

1. Field of Invention

The present invention relates to the field of computers. In particular it relates to computer based methods that are used to ascertain the operational state of batteries used in motorized vehicles.

2. Prior Art

All batteries fail. The automobile battery is particularly onerous. Automobile manufacturers currently provide only the real-time state of the car's charging system (alternator) when the engine is running. The charge state and the robustness of the battery are not known.

Automobile battery malfunctions are seldom caused by a factory defect; driving habits are the more common culprits. The heavy auxiliary power drawn during a short distance driven never allows the periodic fully saturated charge that is so important for the longevity of a lead acid battery.

A German manufacturer of luxury cars reveals that of every 400 car batteries returned under warranty, 200 are working well and have no problem. Low charge and acid stratification are the most common causes of the apparent failure. The car manufacturer says that the problem is more common on large luxury cars offering power-hungry auxiliary options than on the more basic models.

It would be important to know when the operational state of a battery has deteriorated sufficiently to signal that a failure is impending. In some situations this information could be life-saving such as when operating in combat zones or under severe weather conditions. It would also be important to know the charge state of the battery. It would be desirable to know that by merely changing the usage pattern of a vehicle such as combining multiple shopping trips into a single extended trip or by knowing when to apply an external battery charger that the life of the battery would be extended and impending failures avoided.

BRIEF SUMMARY OF THE INVENTION

In particular, this invention relates to those methods by which a computer based system that includes facilities for measuring time, for measuring the voltage of the battery, for measuring the temperature of the battery, and for maintaining a history of these measurements can provide the operational state of the vehicle's battery.

The present invention makes use of a computer system that either installs in the vicinity of the vehicle's battery, typically under the hood, or installs remotely from the battery, typically on the automobile's dash. The computer system contains facilities for directly or indirectly attaching to and measuring the battery's power source. The computer system also includes a temperature sensor, a means for measuring time and a data storage facility for retaining a history of measurements. The computer system measures the elapsed time since the engine last operated. This elapsed time measurement combined with the temperature of the battery and combined with the voltage of the battery are used to calculate the charge state of the battery. The computer system also measures the instantaneous voltage drop when the engine is started along with the total time taken to execute the start cycle. These measurements are used to determine the robustness of the battery. When the starting voltage drop and/or start time exceed certain thresholds, the operator of the vehicle is warned.

Per one embodiment, when the temperature sensor is physically attached to or resides inside the battery's case, the measured temperature is combined with those algorithms that calculate and store the state of charge, that measure and store the instantaneous start voltage and that measure and store the engine start time. These algorithms also make use of the temperature based stored data to determine the operational state of the battery.

Per another embodiment, when the temperature sensor is not physically attached to the battery's case, a computer algorithm is used to approximate the temperature of the battery using a temperature sensor inside the vehicle's cabin. Other algorithms make use of this approximated temperature when calculating the charge state of the battery, when measuring and saving the instantaneous start voltage and when measuring and saving the engine start time. These algorithms make use of the temperature coded data in order to determine the operational state of the battery.

The invention is also directed to non-transitory, electronically-readable storage media that store code for causing an electronic device to perform methods of the invention. The term "non-transitory" is intended to distinguish storage media from transitory electrical signals. However, rewritable memories are understood to be "non-transitory".

DETAILED DESCRIPTION OF THE INVENTION

The following descriptions are provided to enable any person skilled in the art to make and use the invention and is provided in the context of one particular embodiment. Various modifications to the embodiment are possible and the generic principles defined herein may be applied to this and other embodiments without departing from the spirit and scope of the invention. Thus the invention is not intended to be limited to the embodiment shown but is to be accorded the widest scope consistent with the principles, features and teachings disclosed herein.

In accordance with one embodiment, the present invention makes use of a single computer system that is located inside the vehicle's cabin. The temperature sensor in this computer system resides inside the computer system's case so it is therefore remote from and does not come into physical contact with the starter battery's case.

Figure 1:
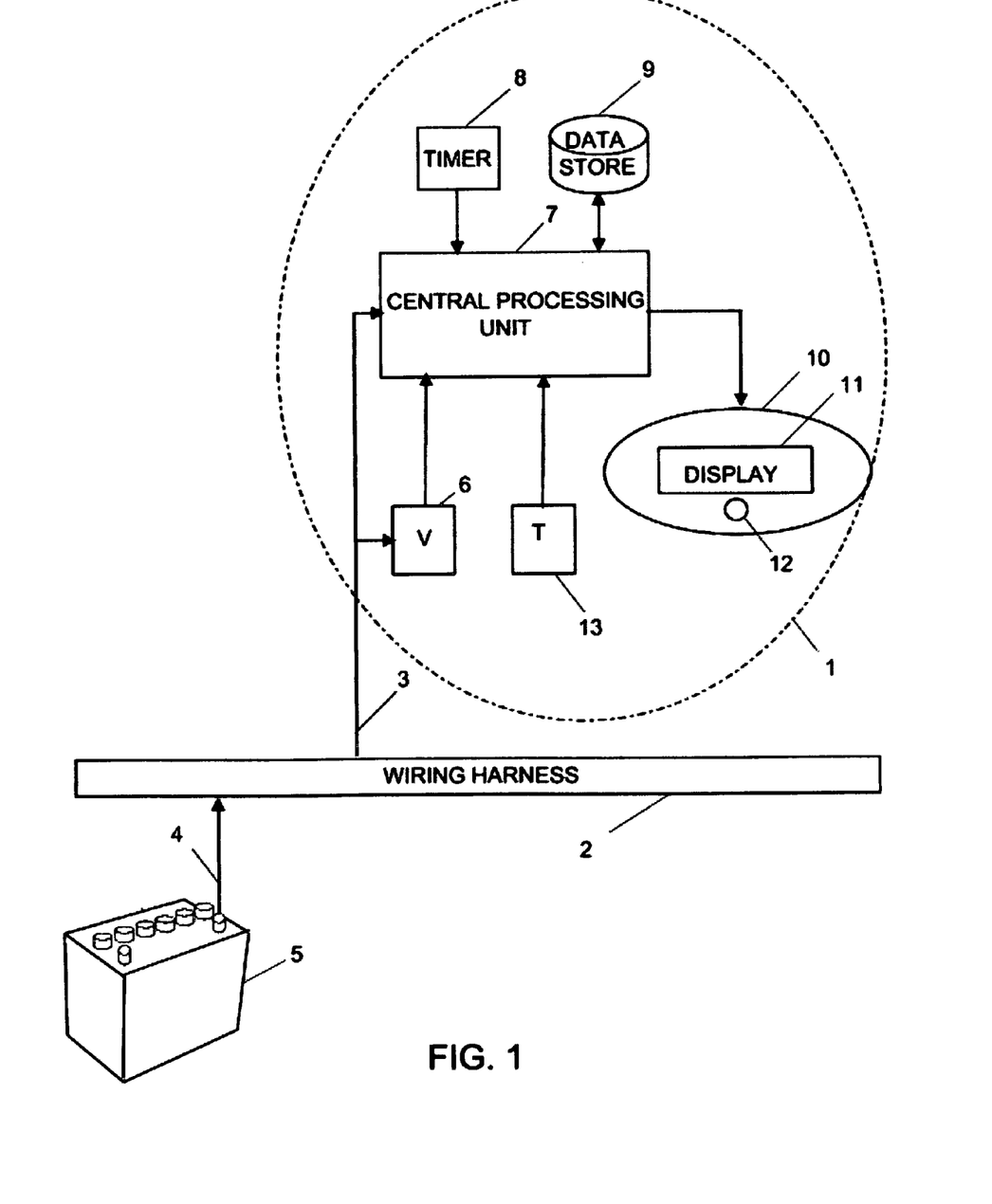
FIG. 1 is a block diagram of a computer based system with capabilities for measuring a starter battery's voltage, measuring time, measuring temperature and saving information in non-volatile memory. This figure shows an example of the type of system utilized with the algorithms of this invention. In this example the temperature sensor is included inside the computer system's enclosure and is therefore remote from the starter battery.

FIG. 1 is a block diagram illustrating a remote computer system. Computer system 1 attaches to the vehicle's wiring harness 2 using wire 3. The wiring harness 2 includes a power wire 4 that is attached to the vehicle's battery 5. The power from the wiring harness 2 is used to power computer system 1 from wire 3. (A ground line between the computer system 1 and the grounded terminal of the battery 5 has not been illustrated but will be apparent to those skilled in the art.) The power from wiring harness 2 is also fed into voltage sensor 6 which allows central processing unit 7 to sample the vehicle's voltage at any instant in time. Temperature sensor 13 is periodically sampled by central processing unit 7. Time is measured by timer 8. By means specified in the software algorithms of this invention, computer system 1 renders the operational state of the battery based upon voltage readings, temperature readings, time and history. These algorithms make use of the history contained in data store 9. Central processing unit 7 displays battery related data on display 11 of console 10 when so directed by the console control 12. Under those conditions wherein a battery alarm is triggered, central processing unit 7 overrides console control 12 and causes the alarm information to be shown immediately and unconditionally to the operator on display 11.

Figure 1A:
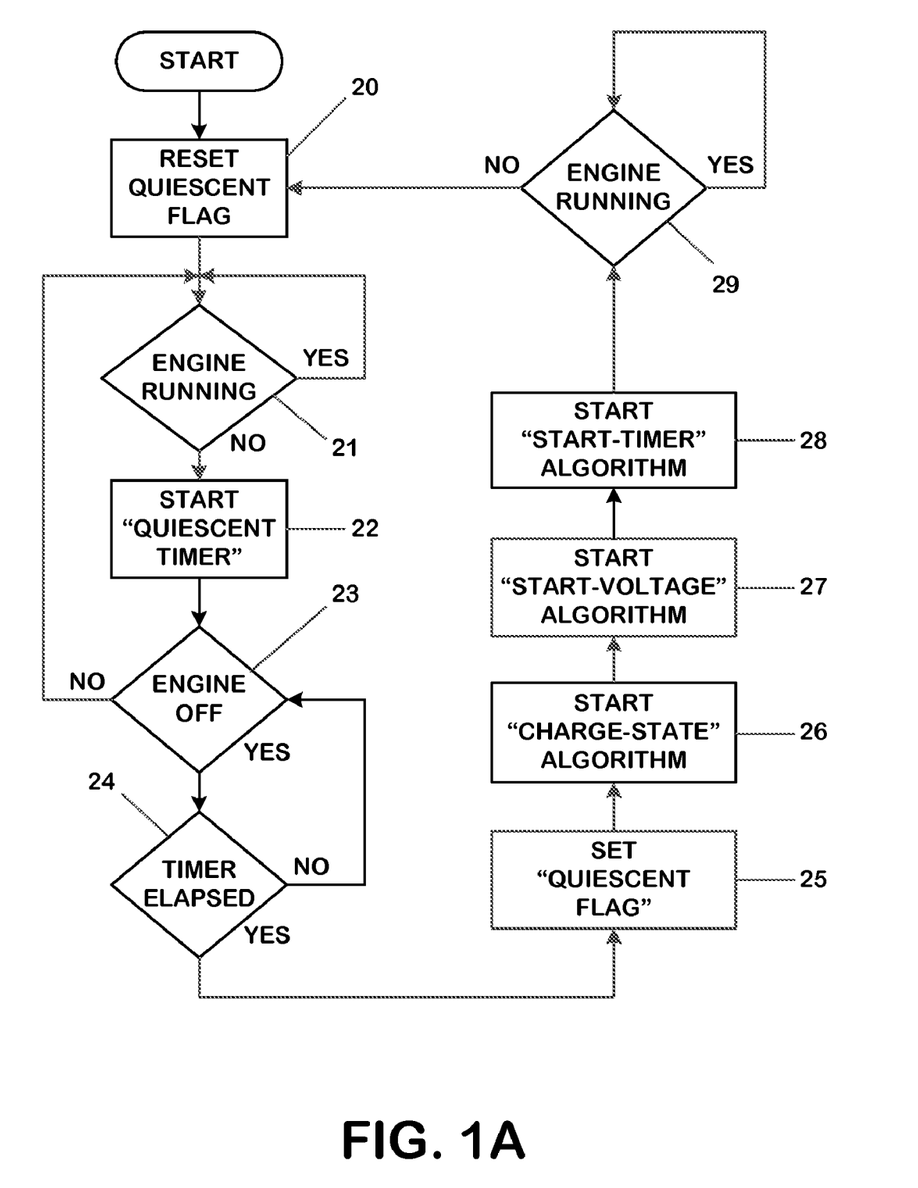
FIG. 1A is a flow chart illustrating the steps taken by the Temperature Approximation algorithm in order to determine the approximate temperature of the battery.

FIG. 1A is a flowchart illustrating the steps taken by the Temperature Adjustment algorithm while executing in computer system 1 of FIG. 1 in order to approximate the temperature of the remote starter battery. In step 20 the Quiescent Flag is reset. The Quiescent Flag, when set, tells the other algorithms that the engine has been off for a sufficient amount of time so that the temperature of the battery now approximates the temperature measured by computer system 1 in FIG. 1. This flag also informs the Charge-State algorithm that the battery has been at rest a sufficient amount of time so that its charge state of the battery can be determined. In step 21, if the engine is running, the Temperature Adjustment algorithm does nothing until the engine has stopped. The voltage measured by voltage sensor 6 in FIG. 1 is used to differentiate engine activity. In step 22 the quiescent time measurement is initiated in timer block 8 of FIG. 1. Step 23 monitors engine activity. If the engine has restarted, program control returns to step 21. If the engine is off, program control proceeds to step 24. Step 24 monitors the quiescent time. If the quiescent time has elapsed, program control goes to step 25. If not, program control returns to step 23. In step 25, the Quiescent Flag gets set and program control proceeds to step 26. Step 26 causes the Charge State algorithm to execute. Step 27 causes the Start-Voltage algorithm to execute. Step 28 causes the Start-Time algorithm to execute. Step 29 waits until the engine is turned off before finally passing program control back to step 20. The algorithm repeats.

Figure 1B:
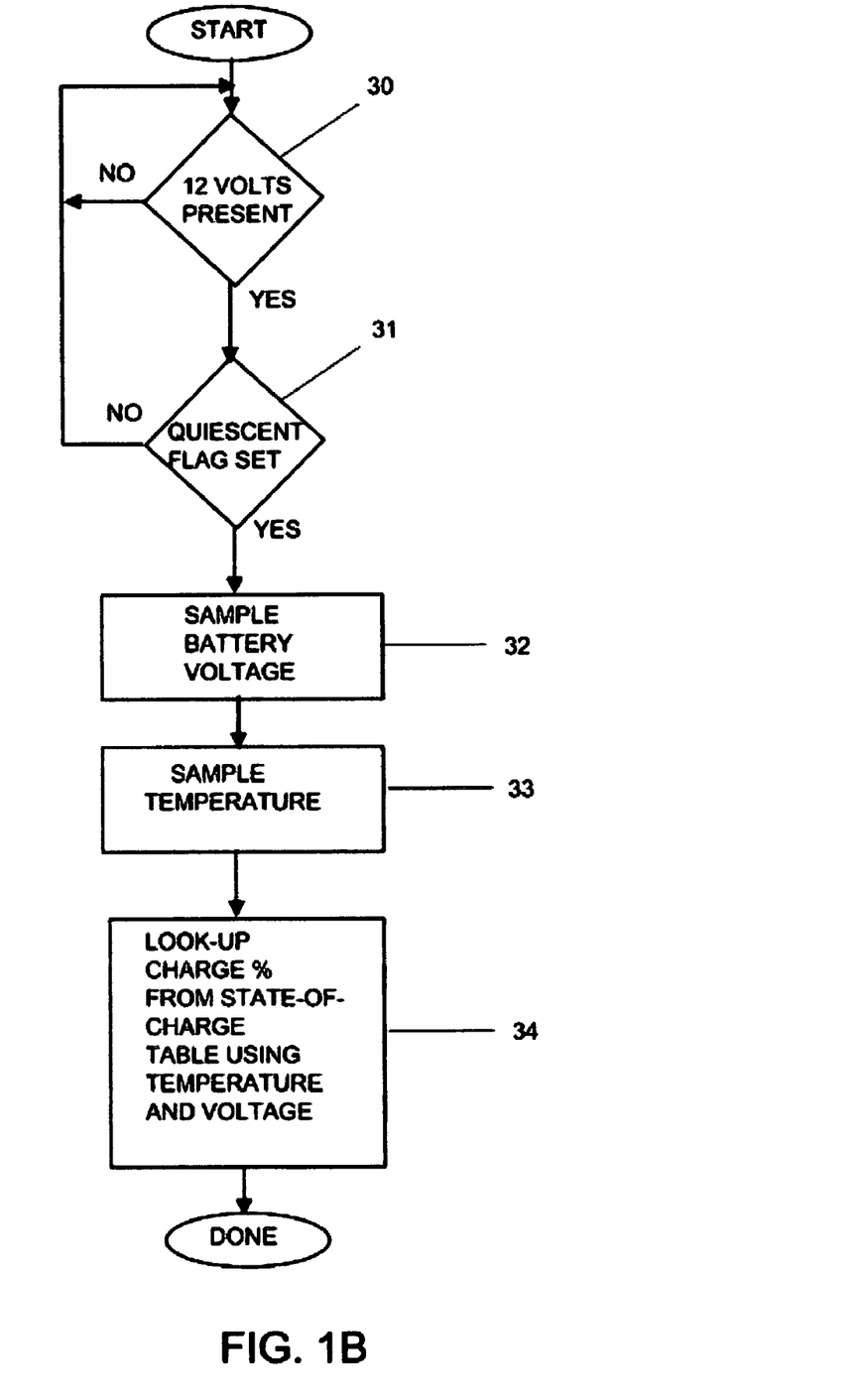
FIG. 1B is a flow chart illustrating the steps taken by the Charge-State algorithm in order to calculate the battery's charge state.

FIG. 1B is a flowchart illustrating the steps taken by the Charge State algorithm while executing in computer system 1 of FIG. 1 in order to determine the charge state of the remote starter battery. In step 30 a check is made to determine if the 12 volts from the starter battery is present. It is possible that this information has been made unavailable by the ignition switch. Program control precedes to step 31 when the 12 volts is present. In step 31 program control proceeds to step 32 when the engine has been off for a predetermined amount of time as made known by the Quiescent Flag. Step 32 samples the current voltage of the starter battery by reading voltage sensor 6 of FIG. 1. Step 33 then samples temperature sensor 13 of FIG. 1. Finally in step 34 the charge state of the battery is rendered from a Temperature Compensated State-of-Charge (SoC) Table based upon the current temperature and current voltage. This table is made available in the public domain. The algorithm is now done until the engine goes into a quiescent state for a predetermined amount of time.

Figure 1C:
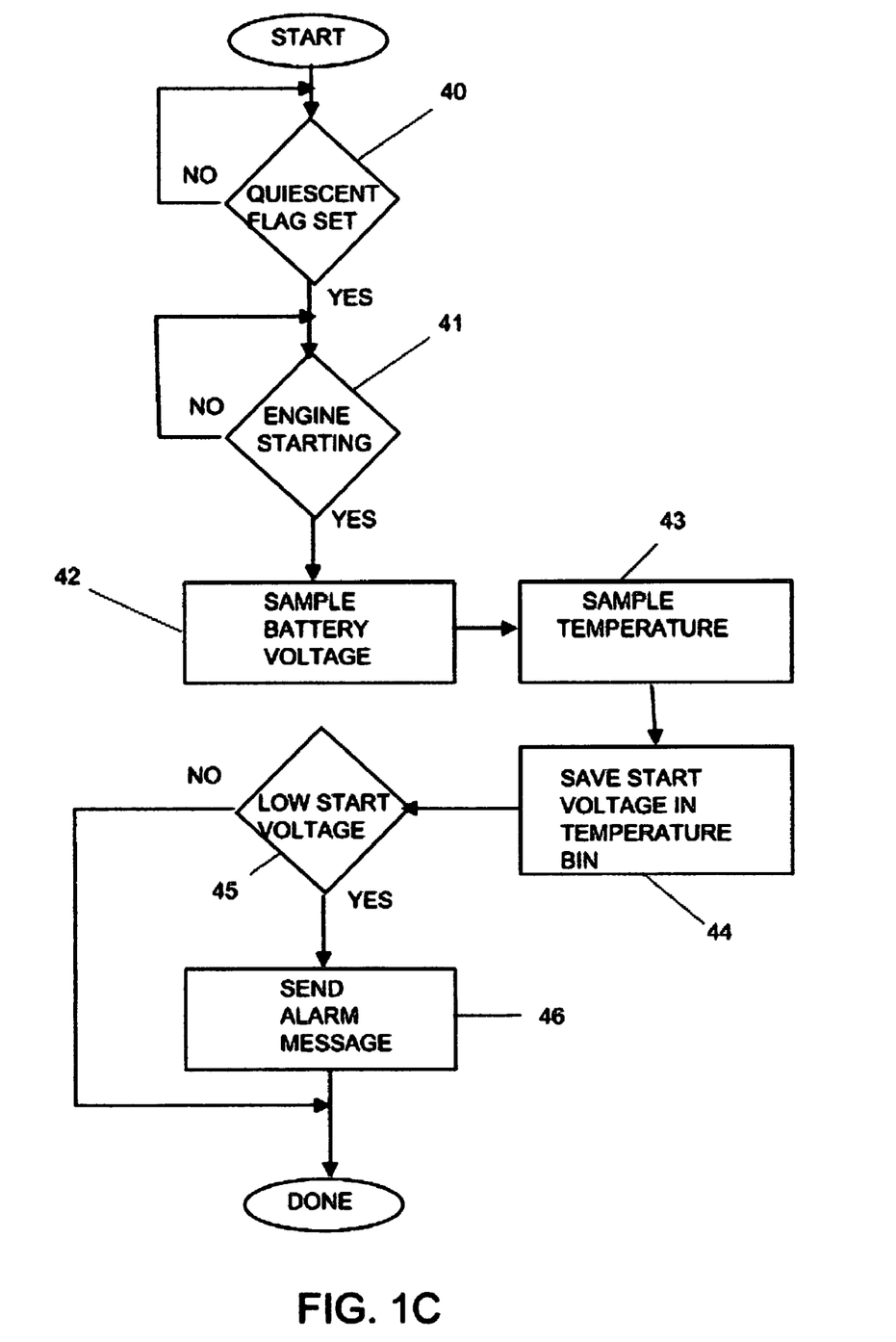
FIG. 1C is a flow chart illustrating the steps taken by the Start-Voltage algorithm in order to determine the operational state of the battery.

FIG. 1C is a flowchart illustrating the steps taken by the Start-Voltage algorithm while executing in computer system 1 of FIG. 1 in order to determine the initial voltage drop of the starter battery. In step 40 program control does not advance until the engine has been off for a predetermined amount of time as indicated by the Quiescent Flag. After the engine has been sufficiently off, program control proceeds to step 41 where the voltage read from voltage sensor 6 of FIG. 1 is used to detect a start engine condition. When the engine start operation is detected program control proceeds immediately to step 42 where the initial voltage drop of the battery is read. In step 43 the temperature is read from sensor 13 of FIG. 1. At step 44 the voltage read at step 42 is saved in the temperature bin selected by the current temperature. At step 45, if the starting voltage is below a predetermined threshold as indicated by the temperature indexed history of start operations, an alarm is sent to display 11 of FIG. 1 at step 46. The algorithm is now done until the engine goes into a quiescent state for a predetermined amount of time.

Figure 1D:
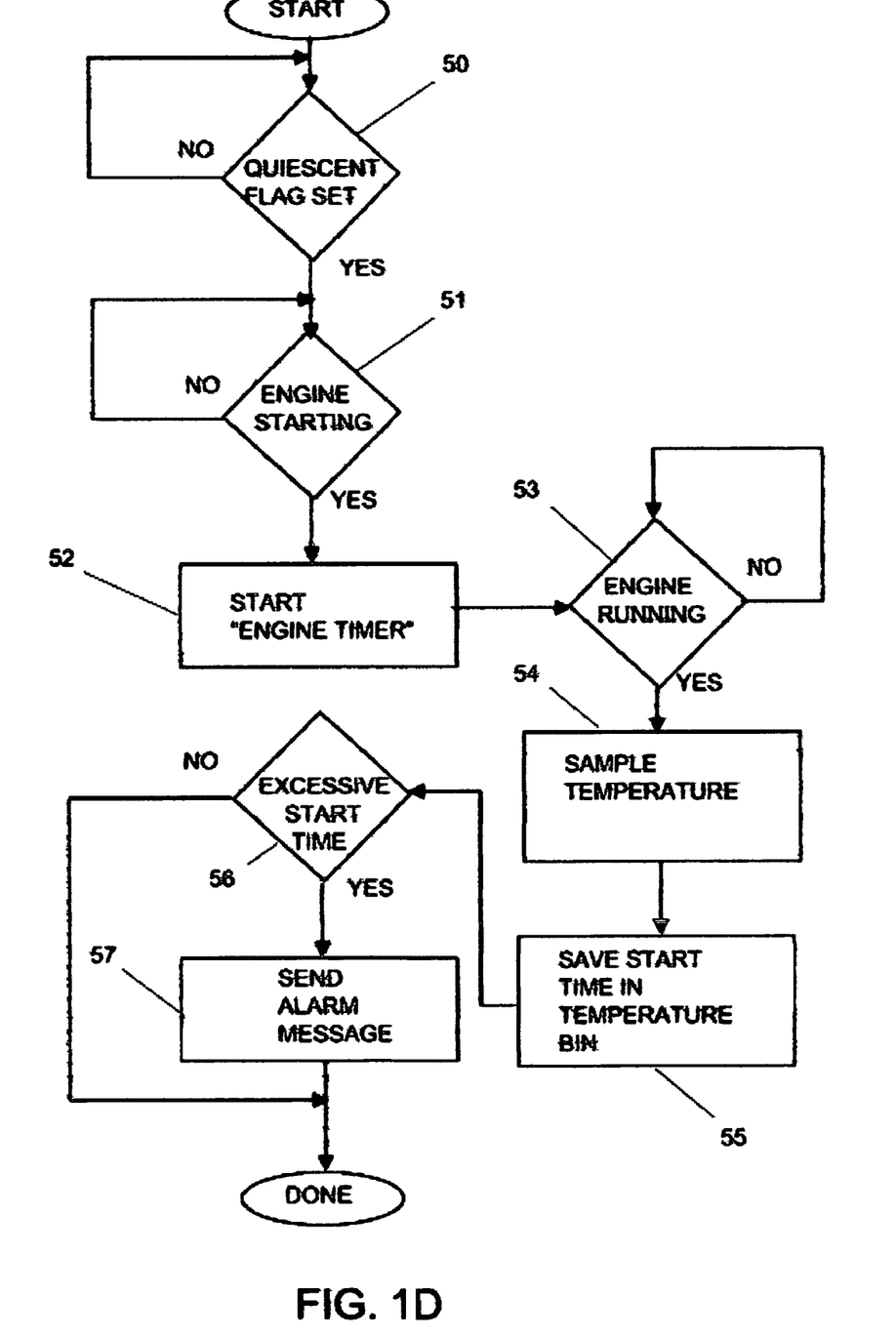
FIG. 1D is a flow chart illustrating the steps taken by the Start-Time algorithm in order to determine the operational state of the battery.

FIG. 1D is a flowchart illustrating the steps taken by the Start-Time algorithm while executing in computer system 1 of FIG. 1 in order to determine the amount of time it takes for the engine to start. In step 50 program control does not advance until the engine has been off for a predetermined amount of time as indicated by the Quiescent Flag. After the engine has been sufficiently off, program control proceeds to step 51 where the voltage read from voltage sensor 6 of FIG. 1 is used to detect a starting engine condition. When the engine start operation is initially detected program control proceeds immediately to step 52 where the Engine Start timer is turned on. Timer block 8 in FIG. 1 is used to instantiate this time function. In step 53 the voltage read from voltage sensor 6 of FIG. 1 is used to determine when the engine is running. When the engine starts running control proceeds to step 54 where the current temperature is read from temperature sensor 13 of FIG. 1. At step 55 the start time measured by the Engine Start timer is saved in a temperature bin selected by the current temperature. At step 56, if the starting time exceeds a predetermined threshold as indicated by the temperature indexed history of start operations, an alarm is sent to display 11 of FIG. 1 at step 57. The algorithm is now done until the engine goes into a quiescent state for a predetermined amount of time.

Advantage

Typically in order to determine the condition of a starter battery, a battery load tester must be made available. Most automobile owners do not own this type of equipment so therefore must take the battery to an automotive shop for testing.

The battery load tester is a constant load device that attaches to both battery terminals. It draws a fixed amount of current for a specified amount of time. The test time is usually somewhere in the 10 to 15 second range. The voltage of the battery at the end of test is used as an indicator of the battery's condition.

Figure 2:
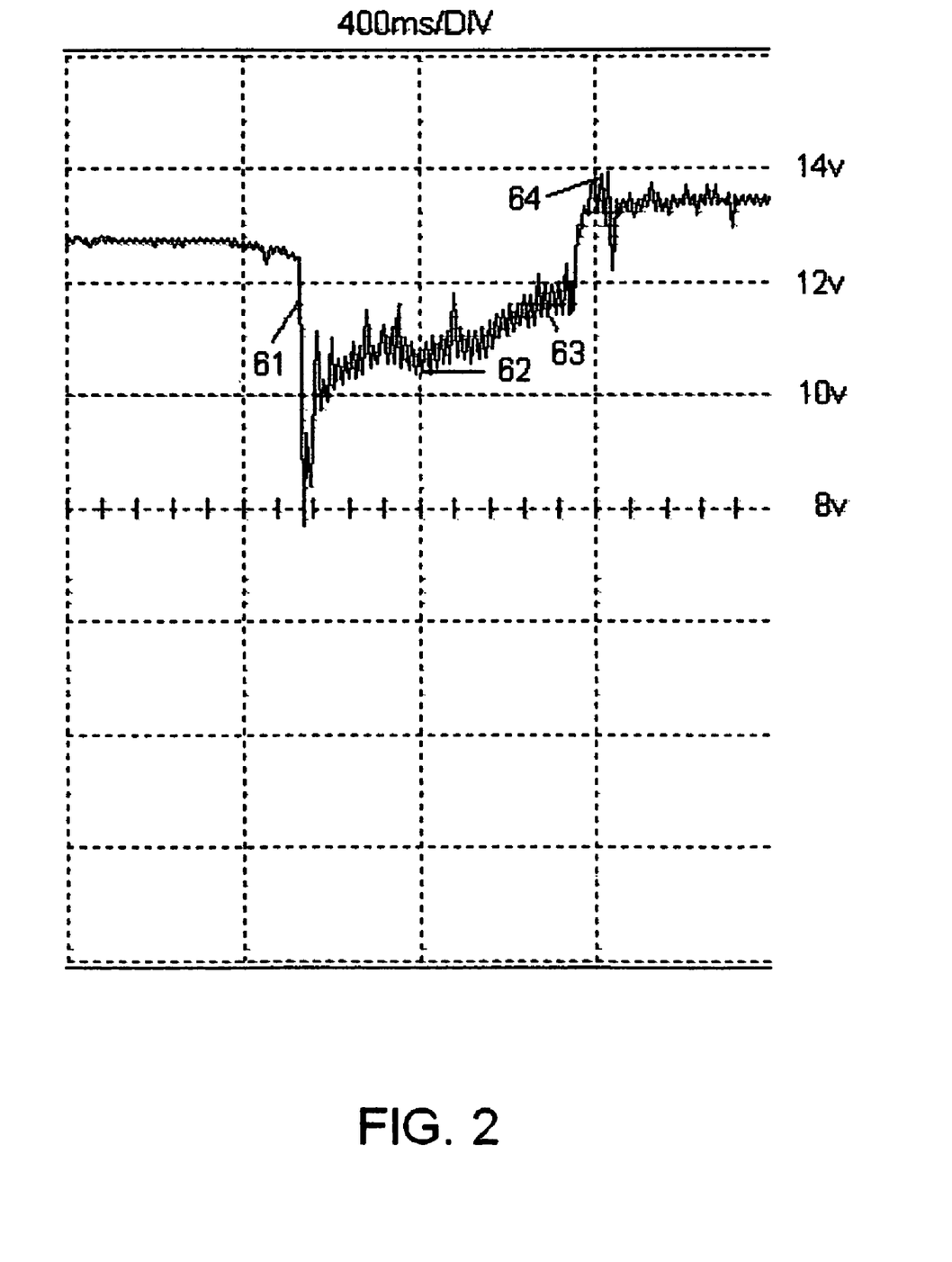
FIG. 2 is a voltage trace taken on a modern automobile during an engine start operation.

The battery load tester does not simulate a real start condition. Depending upon the condition of the engine, the type of engine, the condition of the battery and the temperature under the hood, it typically takes a few hundred milliseconds for an engine to start. This compares unfavorably to the 10-15 seconds of constant load applied by a load tester. When the ignition key is first switched to the Start position, there is a dramatic current surge as the starter motor is engaged. This load far exceeds the load applied by a battery load tester. As the engine overcomes inertia and begins turning, the load on the battery becomes progressively less until finally the engine starts. FIG. 2 is a voltage trace of a start cycle taken on a modern sedan with a high performance V6 engine on a hot day. The initial surge 61 causes the battery voltage to drop below 8 volts. The first revolution of the engine completes at approximately 250 milliseconds as indicated by reference number 62. At approximately 600 milliseconds, as shown by reference number 63, the voltage of the battery has risen to approximately 11.5 volts. At reference 64, the engine has started. Total start time is less than 700 milliseconds.

Two battery load testers purchased from different manufacturers were then used to test the same car. One tester produced a low voltage of 10.3 volts, the other 11.6 volts. Neither tester could simulate the massive voltage drop as shown at reference 61 of FIG. 2. It should also be noted that after just 600 milliseconds the engine load at reference 63 of FIG. 2 was already less than the load maintained by the testers for more than 10 seconds.

The algorithms of this invention have the advantage of monitoring the stress placed upon a starter battery during actual start conditions as opposed to the artificial creation of a somewhat suspect steady state environmental test. The algorithms of this invention have the added and distinct advantage of maintaining a history of previous start operations. A history that is properly cataloged by temperature.

The algorithms of this invention also have the advantage of rendering the charge state of the starter battery, something that is not performed by battery load testers and something that typically takes a technician with a voltmeter, temperature gage, charge state table and the knowledge as to when a charge capacity measurement can be taken.

Finally these algorithms are on duty 24/7. They constantly monitor the operational state of the battery and immediately notify the driver when things have gone awry.

What is claimed is:

1. A battery monitoring system comprising:
   a ground line for coupling to a ground terminal of a battery installed in a vehicle;
   an input line for coupling to a positive terminal of said battery;
   a voltage sensor coupled to said input line and said ground line and operative to provide voltage data indicative of an output voltage of said battery, said voltage data including voltage data acquired during a time period from when a starter of said vehicle is energized by said battery and an engine of said vehicle starts and being indicative of an initial drop in said output voltage of said battery;
   memory operative to store data and code; and
   a processing unit coupled to said memory and said voltage sensor and responsive to said code being operative to
      receive said voltage data from said voltage sensor,
      retrieve voltage data previously provided by said voltage sensor from said memory, said previously provided voltage data being indicative of initial drops in said output voltage of said battery during previous time periods when said starter of said vehicle is energized;
      compare said voltage data from said voltage sensor to said voltage data previously provided by said voltage sensor,
      determine whether said voltage data differs from said previously provided voltage data by at least a predetermined amount, and
      generate a notification signal when said voltage data differs from said previously provided voltage data by at least said predetermined amount; and wherein
   said processing unit is operative to compare said initial drop in said output voltage of said battery with said initial drops in said output voltage of said battery during said previous time periods.

2. The battery monitoring system of claim 1, wherein said processing unit determines when said starter is engaged by analyzing said voltage data.

3. The battery monitoring system of claim 1, further comprising a timer coupled to said processing unit and operative to provide time data to said processing unit.

4. The battery monitoring system of claim 3, wherein responsive to said voltage data and said time data said processing unit is operative to:
   generate start time data indicative of a length of said time period from when said starter of said vehicle is energized by said battery to when said engine of said vehicle starts;
   retrieve start time data previously generated by said processing unit and stored in said memory;
   compare said start time data to said previous start time data; and
   generate said notification signal when said start time data differs from said previous start time data by at least a predetermined amount of time.

5. The battery monitoring system of claim 3, wherein responsive to said voltage data and said time data said processing unit is operative to determine whether a predetermined post-operation time period has passed since said engine of said vehicle last operated.

6. The battery monitoring system of claim 5, further comprising:
   a temperature sensor operative to provide temperature data indicative of a temperature of said battery; and wherein
   said processing unit is operative to compare said voltage data from said voltage sensor to said voltage data previously provided by said voltage sensor based at least in part on said temperature data.

7. The battery monitoring system of claim 6, wherein:
   said temperature sensor is disposed remotely from said battery; and
   said processing unit is operative to use said temperature data as indicative of said temperature of said battery only after said post operation time period has passed and before said engine is next started.

8. The battery monitoring system of claim 5, wherein responsive to said voltage data and said time data said processing unit is operative to:
- generate start time data only if said post-operation time period has passed since said engine last operated, said start time data indicative of a length of said time period from when said starter of said vehicle is energized by said battery to when said engine of said vehicle starts; and
- store said start time data generated by said processing unit in said memory.

9. The battery monitoring system of claim 5, wherein:
- said voltage data is acquired during said time period from when said starter of said vehicle is energized by said battery and said engine of said vehicle starts, only if said post-operation time period has passed since said engine last operated; and
- said processing unit is operative to store said voltage data in said memory.

10. The battery monitoring system of claim 1, further comprising:
- a temperature sensor operative to provide temperature data indicative of a temperature of said battery; and wherein
- said processing unit is operative to compare said voltage data from said voltage sensor to said voltage data previously provided by said voltage sensor based on said temperature data and temperature data associated with said voltage data previously provided by said voltage sensor.

11. The battery monitoring system of claim 1, further comprising:
- a timer coupled to said processing unit and operative to provide time data to said processing unit; and
- a temperature sensor operative to provide temperature data indicative of a temperature of said battery; and wherein
- said processing unit is operative to determine the operational state of said battery based solely on said voltage data, said time data, said temperature data, said voltage data previously provided by said voltage sensor and stored in said memory, time data previously provided by said timer and stored in said memory, and temperature data previously provided by said temperature sensor and stored in said memory.

12. A method for monitoring a battery, said method comprising:
- receiving voltage data indicative of the output voltage of a battery in a vehicle;
- storing said voltage data in memory to create stored voltage data;
- receiving new voltage data indicative of the output voltage of said battery, said new voltage data including voltage data acquired during a time period from when a starter of said vehicle is energized by said battery and an engine of said vehicle starts and being indicative of an initial drop in said output voltage of said battery during a recent engine start;
- retrieving said stored voltage data, said stored voltage data being indicative of initial drops in said output voltage of said battery during previous engine starts;
- comparing said new voltage data to said stored voltage data using a processing unit;
- determining whether said new voltage data differs from said stored voltage data by at least a predetermined amount; and
- generating a notification signal when said new voltage data differs from said stored voltage data by at least said predetermined amount; and wherein
- said step of comparing said new voltage data to said stored voltage data includes comparing said initial drop in said output voltage of said battery during said recent engine start with at least one of said initial drops in said output voltage of said battery during previous engine starts.

13. The method of claim 12, further comprising identifying said time period from when said starter of said vehicle is energized by said battery and said engine of said vehicle starts by monitoring said output voltage of said battery.

14. The method of claim 12, further comprising:
- receiving time data; and
- associating said time data with said voltage data.

15. The method of claim 14, further comprising:
- determining from said new voltage data and said associated time data the duration of a current start time period from when said starter of said vehicle is energized by said battery to when said engine of said vehicle starts;
- retrieving data indicative of previous start time periods;
- comparing said current start time period to at least one of said previous start time periods; and
- generating said notification signal when said current start time period differs from said at least one of said previous start time periods.

16. The method of claim 14, further comprising determining whether a predetermined post-operation time period has passed since said engine of said vehicle last operated.

17. The method of claim 16, further comprising:
- receiving temperature data indicative of a temperature of said battery; and
- comparing said new voltage data to said stored voltage data based at least in part on said temperature data.

18. The method of claim 17, wherein said step of receiving temperature data indicative of said temperature of said battery includes:
- receiving said temperature data from a temperature sensor disposed away from said battery;
- determining whether said temperature data was acquired after said post operation time period had passed and before said engine was next started; and
- accepting said temperature data as indicative of said temperature of said battery only if said temperature data was acquired after said post operation time period had passed and before said engine was next started.

19. The method of claim 16, further comprising:
- generating start time data indicative of the duration of said time period from when said starter of said vehicle is energized by said battery to when said engine of said vehicle starts, only if said post-operation time period has passed since said engine last operated; and
- storing said start time data.

20. The method of claim 16, further comprising:
- acquiring said voltage data during said time period from when said starter of said vehicle is energized by said battery and said engine of said vehicle starts, only if said post-operation time period has passed since said engine last operated; and
- storing said voltage data in said memory.

21. The method of claim 12, further comprising:
- receiving temperature data indicative of a temperature of said battery; and
- comparing said new voltage data to said stored voltage data based on temperature data associated with said new voltage data and temperature data associated with said stored voltage data.

22. The method of claim 12, further comprising:
receiving time data associated with said new voltage data and stored time data associated said stored voltage data;
receiving temperature data associated with said new voltage data and stored temperature data associated with said stored voltage data, said temperature data indicative of a temperature of said battery; and
determining the operational state of said battery based solely on said new voltage data, said time data associated with said new voltage data, said temperature data associated with said new voltage data, said stored voltage data, said stored time data, and said stored temperature data.

23. A non-transitory, electronically-readable storage medium having code embodied therein for causing an electronic device to:
receive voltage data indicative of the output voltage of a battery in a vehicle;
store said voltage data in memory to create stored voltage data;
receive new voltage data indicative of the output voltage of said battery, said new voltage data including voltage data acquired during a time period from when a starter of said vehicle is energized by said battery and an engine of said vehicle starts and being indicative of an initial drop in said output voltage of said battery during a recent engine start;
retrieve said stored voltage data, said stored voltage data being indicative of initial drops in said output voltage of said battery during previous engine starts;
compare said new voltage data to said stored voltage data;
determine whether said new voltage data differs from said stored voltage data by at least a predetermined amount; and
generate a notification signal when said new voltage data differs from said stored voltage data by at least said predetermined amount; and wherein
said code is further operative to cause said electronic device to compare said initial drop in said output voltage of said battery during said recent engine start with at least one of said initial drops in said output voltage of said battery during previous engine starts.

24. The non-transitory, electronically-readable storage medium of claim 23, wherein said code is further operative to cause said electronic device to identify said time period from when said starter of said vehicle is energized by said battery and said engine of said vehicle starts by monitoring said output voltage of said battery.

25. The non-transitory, electronically-readable storage medium of claim 23, wherein said code is further operative to cause said electronic device to:
receive time data; and
associate said time data with said voltage data.

26. The non-transitory, electronically-readable storage medium of claim 25, wherein said code is further operative to cause said electronic device to:
determine from said new voltage data and said associated time data the duration of a current start time period from when said starter of said vehicle is energized by said battery to when said engine of said vehicle starts;
retrieve data indicative of previous start time periods;
compare said current start time period to at least one of said previous start time periods; and
generate said notification signal when said current start time period differs from said at least one of said previous start time periods.

27. The non-transitory, electronically-readable storage medium of claim 25, wherein said code is further operative to cause said electronic device to determine whether a predetermined post-operation time period has passed since said engine of said vehicle last operated.

28. The non-transitory, electronically-readable storage medium of claim 27, wherein said code is further operative to cause said electronic device to:
receive temperature data indicative of a temperature of said battery; and
compare said new voltage data to said stored voltage data based at least in part on said temperature data.

29. The non-transitory, electronically-readable storage medium of claim 28, wherein said code is further operative to cause said electronic device to:
receive said temperature data from a temperature sensor disposed away from said battery;
determine whether said temperature data was acquired after said post operation time period had passed and before said engine was next started; and
accept said temperature data as indicative of said temperature of said battery only if said temperature data was acquired after said post operation time period had passed and before said engine was next started.

30. The non-transitory, electronically-readable storage medium of claim 27, wherein said code is further operative to cause said electronic device to:
generate start time data indicative of the duration of said time period from when said starter of said vehicle is energized by said battery to when said engine of said vehicle starts, only if said post-operation time period has passed since said engine last operated; and
store said start time data.

31. The non-transitory, electronically-readable storage medium of claim 27, wherein said code is further operative to cause said electronic device to:
acquire said voltage data during said time period from when said starter of said vehicle is energized by said battery and said engine of said vehicle starts, only if said post-operation time period has passed since said engine last operated; and
store said voltage data in said memory.

32. The non-transitory, electronically-readable storage medium of claim 23, wherein said code is further operative to cause said electronic device to:
receive temperature data indicative of a temperature of said battery; and
compare said new voltage data to said stored voltage data based on temperature data associated with said new voltage data and temperature data associated with said stored voltage data.

33. The non-transitory, electronically-readable storage medium of claim 23, wherein said code is further operative to cause said electronic device to:
receive time data associated with said new voltage data and stored time data associated said stored voltage data;
receive temperature data associated with said new voltage data and stored temperature data associated with said stored voltage data, said temperature data indicative of a temperature of said battery; and
determine the operational state of said battery based solely on said new voltage data, said time data associated with said new voltage data, said temperature data associated with said new voltage data, said stored voltage data, said stored time data, and said stored temperature data.

34. A battery monitoring system comprising:
a ground line for coupling to a ground terminal of a battery installed in a vehicle;
an input line for coupling to a positive terminal of said battery;
a voltage sensor coupled to said input line and said ground line and operative to provide voltage data indicative of an output voltage of said battery;
memory operative to store data and code;
a processing unit coupled to said memory and said voltage sensor and responsive to said code being operative to receive said voltage data from said voltage sensor,
retrieve voltage data previously provided by said voltage sensor from said memory;
compare said voltage data from said voltage sensor to said voltage data previously provided by said voltage sensor,
determine whether said voltage data differs from said previously provided voltage data by at least a predetermined amount, and
generate a notification signal when said voltage data differs from said previously provided voltage data by at least said predetermined amount; and
a timer coupled to said processing unit and operative to provide time data to said processing unit; and wherein
responsive to said voltage data and said time data said processing unit is operative to
generate start time data indicative of a length of a time period from when a starter of said vehicle is energized by said battery to when an engine of said vehicle starts,
retrieve start time data previously generated by said processing unit and stored in said memory,
compare said start time data to said previous start time data, and
generate said notification signal when said start time data differs from said previous start time data by at least a predetermined amount of time.

35. The battery monitoring system of claim 34, wherein:
said voltage data includes voltage data acquired during said time period from when said starter of said vehicle is energized by said battery and said engine of said vehicle starts;
said voltage data is indicative of an initial drop in said output voltage of said battery;
said previously provided voltage data is indicative of initial drops in said output voltage of said battery during previous time periods when said starter of said vehicle is energized;
said processing unit is operative to compare said initial drop in said output voltage of said battery with said initial drops in said output voltage of said battery during said previous time periods; and
said processing unit determines when said starter is engaged by analyzing said voltage data.

36. The battery monitoring system of claim 34, wherein responsive to said voltage data and said time data said processing unit is operative to determine whether a predetermined post-operation time period has passed since said engine of said vehicle last operated.

37. The battery monitoring system of claim 36, further comprising:
a temperature sensor operative to provide temperature data indicative of a temperature of said battery; and wherein
said processing unit is operative to compare said voltage data from said voltage sensor to said voltage data previously provided by said voltage sensor based at least in part on said temperature data.

38. The battery monitoring system of claim 37, wherein:
said temperature sensor is disposed remotely from said battery; and
said processing unit is operative to use said temperature data as indicative of said temperature of said battery only after said post operation time period has passed and before said engine is next started.

39. The battery monitoring system of claim 36, wherein responsive to said voltage data and said time data said processing unit is operative to:
generate start time data only if said post-operation time period has passed since said engine last operated; and
store said start time data generated by said processing unit in said memory.

40. The battery monitoring system of claim 36, wherein:
said voltage data is acquired during said time period from when said starter of said vehicle is energized by said battery and said engine of said vehicle starts, only if said post-operation time period has passed since said engine last operated;
said voltage data is indicative of an initial drop in said output voltage of said battery; and
said processing unit is operative to store said voltage data in said memory.

41. The battery monitoring system of claim 34, further comprising:
a temperature sensor operative to provide temperature data indicative of a temperature of said battery; and wherein
said processing unit is operative to compare said voltage data from said voltage sensor to said voltage data previously provided by said voltage sensor based on said temperature data and temperature data associated with said voltage data previously provided by said voltage sensor.

42. The battery monitoring system of claim 34, further comprising:
a temperature sensor operative to provide temperature data indicative of a temperature of said battery; and wherein
said processing unit is operative to determine the operational state of said battery based solely on said voltage data, said time data, said temperature data, said voltage data previously provided by said voltage sensor and stored in said memory, time data previously provided by said timer and stored in said memory, and temperature data previously provided by said temperature sensor and stored in said memory.

43. A battery monitoring system comprising:
a ground line for coupling to a ground terminal of a battery installed in a vehicle;
an input line for coupling to a positive terminal of said battery;
a voltage sensor coupled to said input line and said ground line and operative to provide voltage data indicative of an output voltage of said battery;
memory operative to store data and code;
a processing unit coupled to said memory and said voltage sensor and responsive to said code being operative to receive said voltage data from said voltage sensor,
retrieve voltage data previously provided by said voltage sensor from said memory;
compare said voltage data from said voltage sensor to said voltage data previously provided by said voltage sensor, determine whether said voltage data differs from said previously provided voltage data by at least a predetermined amount, and generate a notification signal when said voltage data differs from said previously provided voltage data by at least said predetermined amount; and a timer coupled to said processing unit and operative to provide time data to said processing unit; and wherein responsive to said voltage data and said time data said processing unit is operative to determine whether a predetermined post-operation time period has passed since an engine of said vehicle last operated.

44. The battery monitoring system of claim 43, wherein:

said voltage data includes voltage data acquired during a time period from when a starter of said vehicle is energized by said battery and an engine of said vehicle starts;

said voltage data is indicative of an initial drop in said output voltage of said battery;

said previously provided voltage data is indicative of initial drops in said output voltage of said battery during previous time periods when said starter of said vehicle is energized;

said processing unit is operative to compare said initial drop in said output voltage of said battery with said initial drops in said output voltage of said battery during said previous time periods; and said processing unit determines when said starter is engaged by analyzing said voltage data.

45. The battery monitoring system of claim 43, further comprising:

a temperature sensor operative to provide temperature data indicative of a temperature of said battery; and wherein said processing unit is operative to compare said voltage data from said voltage sensor to said voltage data previously provided by said voltage sensor based at least in part on said temperature data.

46. The battery monitoring system of claim 45, wherein:

said temperature sensor is disposed remotely from said battery; and said processing unit is operative to use said temperature data as indicative of said temperature of said battery only after said post operation time period has passed and before said engine is next started.

47. The battery monitoring system of claim 43, wherein responsive to said voltage data and said time data said processing unit is operative to:

generate start time data only if said post-operation time period has passed since said engine last operated, said start time data indicative of a length of a time period from when a starter of said vehicle is energized by said battery to when said engine of said vehicle starts; and store said start time data generated by said processing unit in said memory.

48. The battery monitoring system of claim 43, wherein:

said voltage data is acquired during a time period from when a starter of said vehicle is energized by said battery and said engine of said vehicle starts, only if said post-operation time period has passed since said engine last operated;

said voltage data is indicative of an initial drop in said output voltage of said battery; and said processing unit is operative to store said voltage data in said memory.

49. The battery monitoring system of claim 43, further comprising:

a temperature sensor operative to provide temperature data indicative of a temperature of said battery; and wherein said processing unit is operative to compare said voltage data from said voltage sensor to said voltage data previously provided by said voltage sensor based on said temperature data and temperature data associated with said voltage data previously provided by said voltage sensor.

50. The battery monitoring system of claim 43, further comprising:

a temperature sensor operative to provide temperature data indicative of a temperature of said battery; and wherein said processing unit is operative to determine the operational state of said battery based solely on said voltage data, said time data, said temperature data, said voltage data previously provided by said voltage sensor and stored in said memory, time data previously provided by said timer and stored in said memory, and temperature data previously provided by said temperature sensor and stored in said memory.

51. A method for monitoring a battery, said method comprising:

receiving voltage data indicative of the output voltage of a battery in a vehicle;

receiving time data;

associating said time data with said voltage data;

storing said voltage data in memory to create stored voltage data;

receiving new voltage data indicative of the output voltage of said battery;

retrieving said stored voltage data;

comparing said new voltage data to said stored voltage data using a processing unit;

determining whether said new voltage data differs from said stored voltage data by at least a predetermined amount;

determining from said new voltage data and said associated time data the duration of a current start time period from when a starter of said vehicle is energized by said battery to when an engine of said vehicle starts;

retrieving data indicative of previous start time periods;

comparing said current start time period to at least one of said previous start time periods;

generating a notification signal when said new voltage data differs from said stored voltage data by at least said predetermined amount; and generating said notification signal when said current start time period differs from said at least one of said previous start time periods.

52. The method of claim 51, further comprising:

identifying a time period from when a starter of said vehicle is energized by said battery and an engine of said vehicle starts by monitoring said output voltage of said battery; and wherein said new voltage data includes voltage data acquired during said time period from when said starter of said vehicle is energized by said battery and said engine of said vehicle starts;

said new voltage data is indicative of an initial drop in said output voltage of said battery during a recent engine start;

said stored voltage data is indicative of initial drops in said output voltage of said battery during previous engine starts; and said step of comparing said new voltage data to said stored voltage data includes comparing said initial drop in said output voltage of said battery during said recent engine start with at least one of said initial drops in said output voltage of said battery during previous engine starts.

53. The method of claim 51, further comprising determining whether a predetermined post-operation time period has passed since an engine of said vehicle last operated.

54. The method of claim 53, further comprising:
receiving temperature data indicative of a temperature of said battery; and
comparing said new voltage data to said stored voltage data based at least in part on said temperature data.

55. The method of claim 54, wherein said step of receiving temperature data indicative of said temperature of said battery includes:
receiving said temperature data from a temperature sensor disposed away from said battery;
determining whether said temperature data was acquired after said post operation time period had passed and before said engine was next started; and
accepting said temperature data as indicative of said temperature of said battery only if said temperature data was acquired after said post operation time period had passed and before said engine was next started.

56. The method of claim 53, further comprising:
generating start time data indicative of the duration of said time period from when said starter of said vehicle is energized by said battery to when said engine of said vehicle starts, only if said post-operation time period has passed since said engine last operated; and
storing said start time data.

57. The method of claim 53, further comprising:
acquiring said voltage data during said time period from when said starter of said vehicle is energized by said battery and said engine of said vehicle starts, only if said post-operation time period has passed since said engine last operated; and
storing said voltage data in said memory.

58. The method of claim 51, further comprising:
receiving temperature data indicative of a temperature of said battery; and
comparing said new voltage data to said stored voltage data based on temperature data associated with said new voltage data and temperature data associated with said stored voltage data.

59. The method of claim 51, further comprising:
receiving time data associated with said new voltage data and stored time data associated said stored voltage data;
receiving temperature data associated with said new voltage data and stored temperature data associated with said stored voltage data, said temperature data indicative of a temperature of said battery; and
determining the operational state of said battery based solely on said new voltage data, said time data associated with said new voltage data, said temperature data associated with said new voltage data, said stored voltage data, said stored time data, and said stored temperature data.

60. A method for monitoring a battery, said method comprising:
receiving voltage data indicative of the output voltage of a battery in a vehicle;
receiving time data;
associating said time data with said voltage data;
storing said voltage data in memory to create stored voltage data;
receiving new voltage data indicative of the output voltage of said battery;
determining whether a predetermined post-operation time period has passed since an engine of said vehicle last operated;
retrieving said stored voltage data;
comparing said new voltage data to said stored voltage data using a processing unit;
determining whether said new voltage data differs from said stored voltage data by at least a predetermined amount; and
generating a notification signal when said new voltage data differs from said stored voltage data by at least said predetermined amount.

61. The method of claim 60, further comprising:
identifying a time period from when a starter of said vehicle is energized by said battery and an engine of said vehicle starts by monitoring said output voltage of said battery; and wherein
said new voltage data includes voltage data acquired during said time period from when said starter of said vehicle is energized by said battery and said engine of said vehicle starts;
said new voltage data is indicative of an initial drop in said output voltage of said battery during a recent engine start;
said stored voltage data is indicative of initial drops in said output voltage of said battery during previous engine starts; and
said step of comparing said new voltage data to said stored voltage data includes comparing said initial drop in said output voltage of said battery during said recent engine start with at least one of said initial drops in said output voltage of said battery during previous engine starts.

62. The method of claim 60, further comprising:
receiving temperature data indicative of a temperature of said battery; and
comparing said new voltage data to said stored voltage data based at least in part on said temperature data.

63. The method of claim 62, wherein said step of receiving temperature data indicative of said temperature of said battery includes:
receiving said temperature data from a temperature sensor disposed away from said battery;
determining whether said temperature data was acquired after said post operation time period had passed and before said engine was next started; and
accepting said temperature data as indicative of said temperature of said battery only if said temperature data was acquired after said post operation time period had passed and before said engine was next started.

64. The method of claim 60, further comprising:
generating start time data indicative of the duration of a time period from when a starter of said vehicle is energized by said battery to when an engine of said vehicle starts, only if said post-operation time period has passed since said engine last operated; and
storing said start time data.

65. The method of claim 60, further comprising:
acquiring said voltage data during a time period from when a starter of said vehicle is energized by said battery and an engine of said vehicle starts, only if said post-operation time period has passed since said engine last operated; and
storing said voltage data in said memory.

66. The method of claim 60, further comprising:
receiving temperature data indicative of a temperature of said battery; and
comparing said new voltage data to said stored voltage data based on temperature data associated with said new voltage data and temperature data associated with said stored voltage data.

67. The method of claim 60, further comprising:
receiving time data associated with said new voltage data and stored time data associated said stored voltage data;
receiving temperature data associated with said new voltage data and stored temperature data associated with said stored voltage data, said temperature data indicative of a temperature of said battery; and
determining the operational state of said battery based solely on said new voltage data, said time data associated with said new voltage data, said temperature data associated with said new voltage data, said stored voltage data, said stored time data, and said stored temperature data.

68. A method for monitoring a battery, said method comprising:
receiving voltage data indicative of the output voltage of a battery in a vehicle;
storing said voltage data in memory to create stored voltage data;
receiving new voltage data indicative of the output voltage of said battery;
retrieving said stored voltage data;
receiving time data associated with said new voltage data and stored time data associated said stored voltage data;
receiving temperature data associated with said new voltage data and stored temperature data associated with said stored voltage data, said temperature data indicative of a temperature of said battery;
determining the operational state of said battery based solely on said new voltage data, said time data associated with said new voltage data, said temperature data associated with said new voltage data, said stored voltage data, said stored time data, and said stored temperature data;
comparing said new voltage data to said stored voltage data using a processing unit;
determining whether said new voltage data differs from said stored voltage data by at least a predetermined amount; and
generating a notification signal when said new voltage data differs from said stored voltage data by at least said predetermined amount.

69. The method of claim 68, further comprising:
identifying a time period from when a starter of said vehicle is energized by said battery and an engine of said vehicle starts by monitoring said output voltage of said battery; and wherein
said new voltage data includes voltage data acquired during said time period from when said starter of said vehicle is energized by said battery and said engine of said vehicle starts;
said new voltage data is indicative of an initial drop in said output voltage of said battery during a recent engine start;
said stored voltage data is indicative of initial drops in said output voltage of said battery during previous engine starts; and
said step of comparing said new voltage data to said stored voltage data includes comparing said initial drop in said output voltage of said battery during said recent start with at least one of said initial drops in said output voltage of said battery during previous engine starts.

70. The method of claim 68, further comprising:
receiving time data; and
associating said time data with said voltage data.

71. The method of claim 70, further comprising:
determining whether a predetermined post-operation time period has passed since an engine of said vehicle last operated;
receiving temperature data indicative of said temperature of said battery; and
comparing said new voltage data to said stored voltage data based at least in part on said temperature data.

72. The method of claim 71, wherein said step of receiving temperature data indicative of said temperature of said battery includes:
receiving said temperature data from a temperature sensor disposed away from said battery;
determining whether said temperature data was acquired after said post operation time period had passed and before said engine was next started; and
accepting said temperature data as indicative of said temperature of said battery only if said temperature data was acquired after said post operation time period had passed and before said engine was next started.

73. The method of claim 70, further comprising:
determining whether a predetermined post-operation time period has passed since said engine of said vehicle last operated;
generating start time data indicative of the duration of a time period from when a starter of said vehicle is energized by said battery to when an engine of said vehicle starts, only if said post-operation time period has passed since said engine last operated; and
storing said start time data.

74. The method of claim 70, further comprising:
determining whether a predetermined post-operation time period has passed since said engine of said vehicle last operated;
acquiring said voltage data during a time period from when a starter of said vehicle is energized by said battery and an engine of said vehicle starts, only if said post-operation time period has passed since said engine last operated; and
storing said voltage data in said memory.

75. The method of claim 68, further comprising:
receiving temperature data indicative of said temperature of said battery; and
comparing said new voltage data to said stored voltage data based on temperature data associated with said new voltage data and temperature data associated with said stored voltage data.

76. A non-transitory, electronically-readable storage medium having code embodied therein for causing an electronic device to:
receive voltage data indicative of the output voltage of a battery in a vehicle;
receive time data;
associate said time data with said voltage data;
store said voltage data in memory to create stored voltage data;
receive new voltage data indicative of the output voltage of said battery;
retrieve said stored voltage data;
compare said new voltage data to said stored voltage data;
determine whether said new voltage data differs from said stored voltage data by at least a predetermined amount;
determine from said new voltage data and said associated time data the duration of a current start time period from when a starter of said vehicle is energized by said battery to when an engine of said vehicle starts;

retrieve data indicative of previous start time periods;
compare said current start time period to at least one of said previous start time periods;
generate a notification signal when said new voltage data differs from said stored voltage data by at least said predetermined amount; and
generate said notification signal when said current start time period differs from said at least one of said previous start time periods.

77. The non-transitory, electronically-readable storage medium of claim 76, wherein:
said code is further operative to cause said electronic device to identify a time period from when a starter of said vehicle is energized by said battery and an engine of said vehicle starts by monitoring said output voltage of said battery;
said new voltage data includes voltage data acquired during said time period from when said starter of said vehicle is energized by said battery and said engine of said vehicle starts;
said new voltage data is indicative of an initial drop in said output voltage of said battery during a recent engine start;
said stored voltage data is indicative of initial drops in said output voltage of said battery during previous engine starts; and
said code is further operative to cause said electronic device to compare said initial drop in said output voltage of said battery during said recent engine start with at least one of said initial drops in said output voltage of said battery during previous engine starts.

78. The non-transitory, electronically-readable storage medium of claim 76, wherein said code is further operative to cause said electronic device to determine whether a predetermined post-operation time period has passed since said engine of said vehicle last operated.

79. The non-transitory, electronically-readable storage medium of claim 78, wherein said code is further operative to cause said electronic device to:
receive temperature data indicative of a temperature of said battery; and
compare said new voltage data to said stored voltage data based at least in part on said temperature data.

80. The non-transitory, electronically-readable storage medium of claim 79, wherein said code is further operative to cause said electronic device to:
receive said temperature data from a temperature sensor disposed away from said battery;
determine whether said temperature data was acquired after said post operation time period had passed and before said engine was next started; and
accept said temperature data as indicative of said temperature of said battery only if said temperature data was acquired after said post operation time period had passed and before said engine was next started.

81. The non-transitory, electronically-readable storage medium of claim 78, wherein said code is further operative to cause said electronic device to:
generate start time data indicative of the duration of a time period from when said starter of said vehicle is energized by said battery to when said engine of said vehicle starts, only if said post-operation time period has passed since said engine last operated; and
store said start time data.

82. The non-transitory, electronically-readable storage medium of claim 78, wherein said code is further operative to cause said electronic device to:
acquire said voltage data during a time period from when said starter of said vehicle is energized by said battery and said engine of said vehicle starts, only if said post-operation time period has passed since said engine last operated; and
store said voltage data in said memory.

83. The non-transitory, electronically-readable storage medium of claim 76, wherein said code is further operative to cause said electronic device to:
receive temperature data indicative of a temperature of said battery; and
compare said new voltage data to said stored voltage data based on temperature data associated with said new voltage data and temperature data associated with said stored voltage data.

84. The non-transitory, electronically-readable storage medium of claim 76, wherein said code is further operative to cause said electronic device to:
receive time data associated with said new voltage data and stored time data associated said stored voltage data;
receive temperature data associated with said new voltage data and stored temperature data associated with said stored voltage data, said temperature data indicative of a temperature of said battery; and
determine the operational state of said battery based solely on said new voltage data, said time data associated with said new voltage data, said temperature data associated with said new voltage data, said stored voltage data, said stored time data, and said stored temperature data.

85. A non-transitory, electronically-readable storage medium having code embodied therein for causing an electronic device to:
receive voltage data indicative of the output voltage of a battery in a vehicle;
receive time data;
associate said time data with said voltage data;
store said voltage data in memory to create stored voltage data;
receive new voltage data indicative of the output voltage of said battery;
determine whether a predetermined post-operation time period has passed since an engine of said vehicle last operated;
retrieve said stored voltage data;
compare said new voltage data to said stored voltage data;
determine whether said new voltage data differs from said stored voltage data by at least a predetermined amount; and
generate a notification signal when said new voltage data differs from said stored voltage data by at least said predetermined amount.

86. The non-transitory, electronically-readable storage medium of claim 85, wherein:
said code is further operative to cause said electronic device to identify a time period from when a starter of said vehicle is energized by said battery and said engine of said vehicle starts by monitoring said output voltage of said battery;
said new voltage data includes voltage data acquired during said time period from when said starter of said vehicle is energized by said battery and said engine of said vehicle starts;

said new voltage data is indicative of an initial drop in said output voltage of said battery during a recent engine start;

said stored voltage data is indicative of initial drops in said output voltage of said battery during previous engine starts; and said code is further operative to cause said electronic device to compare said initial drop in said output voltage of said battery during said recent engine start with at least one of said initial drops in said output voltage of said battery during previous engine starts.

87. The non-transitory, electronically-readable storage medium of claim 85, wherein said code is further operative to cause said electronic device to:

receive temperature data indicative of a temperature of said battery; and compare said new voltage data to said stored voltage data based at least in part on said temperature data.

88. The non-transitory, electronically-readable storage medium of claim 87, wherein said code is further operative to cause said electronic device to:

receive said temperature data from a temperature sensor disposed away from said battery;

determine whether said temperature data was acquired after said post operation time period had passed and before said engine was next started; and accept said temperature data as indicative of said temperature of said battery only if said temperature data was acquired after said post operation time period had passed and before said engine was next started.

89. The non-transitory, electronically-readable storage medium of claim 85, wherein said code is further operative to cause said electronic device to:

generate start time data indicative of the duration of a time period from when a starter of said vehicle is energized by said battery to when said engine of said vehicle starts, only if said post-operation time period has passed since said engine last operated; and store said start time data.

90. The non-transitory, electronically-readable storage medium of claim 85, wherein said code is further operative to cause said electronic device to:

acquire said voltage data during a time period from when a starter of said vehicle is energized by said battery and said engine of said vehicle starts, only if said post-operation time period has passed since said engine last operated; and store said voltage data in said memory.

91. The non-transitory, electronically-readable storage medium of claim 85, wherein said code is further operative to cause said electronic device to:

receive temperature data indicative of a temperature of said battery; and compare said new voltage data to said stored voltage data based on temperature data associated with said new voltage data and temperature data associated with said stored voltage data.

92. The non-transitory, electronically-readable storage medium of claim 85, wherein said code is further operative to cause said electronic device to:

receive time data associated with said new voltage data and stored time data associated said stored voltage data;

receive temperature data associated with said new voltage data and stored temperature data associated with said stored voltage data, said temperature data indicative of a temperature of said battery; and determine the operational state of said battery based solely on said new voltage data, said time data associated with said new voltage data, said temperature data associated with said new voltage data, said stored voltage data, said stored time data, and said stored temperature data.

* * * * *